(12) United States Patent
Wang et al.

(10) Patent No.: US 10,872,933 B2
(45) Date of Patent: Dec. 22, 2020

(54) DISPLAY SUBSTRATE AND MANUFACTURING METHOD THEREOF, DISPLAY PANEL AND DISPLAY APPARATUS

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/567,704

(22) Filed: Sep. 11, 2019

(65) Prior Publication Data
US 2020/0227491 A1 Jul. 16, 2020

(30) Foreign Application Priority Data
Jan. 11, 2019 (CN) .......................... 2019 1 0028175

(51) Int. Cl.
*H01L 29/08* (2006.01)
*H01L 27/32* (2006.01)
(Continued)

(52) U.S. Cl.
CPC ....... *H01L 27/3227* (2013.01); *G09G 3/3225* (2013.01); *H01L 27/3276* (2013.01); *H01L 51/56* (2013.01)

(58) Field of Classification Search
CPC . H01L 27/3227; H01L 27/3276; H01L 51/56; G09G 3/3225
(Continued)

(56) References Cited

U.S. PATENT DOCUMENTS 7,435,968 B2 * 10/2008 Watanabe ......... H01L 27/14609
250/370.09
7,535,506 B2 * 5/2009 Nomura ............ H01L 27/14603
250/208.1
(Continued)

FOREIGN PATENT DOCUMENTS

| CN | 105552086 | 5/2016 |
|---|---|---|
| CN | 107134467 | 9/2017 |

(Continued)

OTHER PUBLICATIONS

1st Office Action dated May 25, 2020 for Chinese Patent Application No. 201910028175.6.

*Primary Examiner* — Caleb E Henry
(74) *Attorney, Agent, or Firm* — Thomas | Horstemeyer LLP

(57) ABSTRACT

The present disclosure relates to the field of the display technology and provides a display substrate and a manufacturing method thereof, a display panel, and a display apparatus. The manufacturing method of the display substrate includes forming an optical compensation control thin film transistor on a side of a base substrate; forming a conductor protective layer on a side of the optical compensation control thin film transistor facing away from the base substrate; forming an optical detecting device material layer on a side of the conductor protective layer facing away from the base substrate; forming an optical detecting device through patterning the optical detecting device material layer; and forming a conductor pattern layer through patterning the conductor protective layer; where, the optical detecting device is electrically connected with a source electrode or a drain electrode of the optical compensation control thin film transistor through the conductor pattern layer.

9 Claims, 4 Drawing Sheets

(51) Int. Cl.
*G09G 3/3225* (2016.01)
*H01L 51/56* (2006.01)

(58) Field of Classification Search
USPC .......................................................... 257/40
See application file for complete search history.

(56) References Cited

U.S. PATENT DOCUMENTS

| | | | |
|---|---|---|---|
| 7,629,564 B2 * | 12/2009 | Mochizuki | H01L 27/12 250/208.1 |
| 7,645,976 B2 * | 1/2010 | Watanabe | H01L 27/14658 250/208.2 |
| 8,368,027 B2 * | 2/2013 | Ishii | G01T 1/2018 250/370.08 |
| 8,575,557 B2 * | 11/2013 | Okada | H04N 5/376 250/370.08 |
| 8,680,472 B2 * | 3/2014 | Mochizuki | H04N 5/3658 250/370.09 |
| 8,759,782 B2 * | 6/2014 | Okada | H04N 5/378 250/370.08 |
| 8,785,873 B2 * | 7/2014 | Mochizuki | H01L 27/14663 250/370.14 |
| 9,277,896 B2 * | 3/2016 | Ofuji | G01T 1/2928 |
| 9,331,119 B2 * | 5/2016 | Fujiyoshi | H01L 27/14612 |
| 9,634,174 B2 * | 4/2017 | Jiroku | H01L 27/14603 |
| 10,537,295 B2 * | 1/2020 | Watanabe | A61B 6/542 |
| 2005/0158906 A1 | 7/2005 | Sato et al. | |
| 2009/0127435 A1 * | 5/2009 | Mochizuki | H01L 27/14603 250/208.1 |
| 2010/0294942 A1 * | 11/2010 | Mochizuki | H04N 5/3655 250/366 |
| 2011/0109532 A1 * | 5/2011 | Choi | H01L 27/1259 345/76 |
| 2011/0221720 A1 * | 9/2011 | Kuo | H01L 27/3269 345/206 |
| 2012/0305785 A1 * | 12/2012 | Fujiyoshi | H01L 27/14687 250/370.08 |
| 2018/0055464 A1 * | 3/2018 | Watanabe | H01L 31/02327 |
| 2018/0108781 A1 * | 4/2018 | Fang | H01L 29/78627 |
| 2020/0161402 A1 * | 5/2020 | Wang | H01L 29/78633 |

FOREIGN PATENT DOCUMENTS

| | | |
|---|---|---|
| CN | 107359168 | 11/2017 |
| CN | 108878503 | 11/2018 |
| JP | H0541512 | 2/1993 |

\* cited by examiner

DISPLAY SUBSTRATE AND MANUFACTURING METHOD THEREOF, DISPLAY PANEL AND DISPLAY APPARATUS

CROSS-REFERENCE TO RELATED APPLICATIONS

The present application claims the priority to Chinese Patent Application No. 201910028175.6, filed on Jan. 11, 2019, which is incorporated herein by reference in its entirety.

TECHNICAL FIELD

The present disclosure relates to the field of the display technology and, in particular, to a display substrate and a manufacturing method thereof, a display panel mounting with the display substrate, and a display apparatus mounting with the display panel.

BACKGROUND

The organic light emitting diode (OLED) display panel is a new type display panel on the market. Since the OLED display panel has self-light emitting characteristics, the OLED display panel has many advantages, such as wide color gamut, high contrast, and ultra-thinness etc., as compared to the liquid crystal display (LCD) panel.

Due to the long-term operation of the OLED display panel in a state of high contrast and high brightness, the recession of the light emitting brightness of the organic light emitting layer in each sub-pixel of the OLED display panel is inconsistent, such that the light emitting of the OLED display panel is uneven, and it is necessary to perform brightness compensation on the sub-pixels in the OLED display panel. Generally, before the OLED display panel is shipped from the factory, the sub-pixels in the OLED display panel are compensated for brightness a single time using professional equipment. After the OLED display panel is shipped, the sub-pixels can no longer be compensated for brightness.

It should be noted that the information disclosed in the above described background only serves to enhance an understanding of the background of the present disclosure, which may include information that does not constitute prior art known to those skilled in the art.

SUMMARY

According to an aspect of the present disclosure, a manufacturing method of a display substrate is provided, the method including:

forming an optical compensation control thin film transistor on a side of a base substrate;

forming a conductor protective layer on a side of the optical compensation control thin film transistor facing away from the base substrate;

forming an optical detecting device material layer on a side of the conductor protective layer facing away from the base substrate; and forming an optical detecting device through patterning the optical detecting device material layer, and forming a conductor pattern layer through patterning the conductor protective layer;

wherein the optical detecting device is electrically connected with a source electrode or a drain electrode of the optical compensation control thin film transistor through the conductor pattern layer.

In an exemplary embodiment of the present disclosure, the optical detecting device and the conductor pattern layer are formed by a one-time patterning process.

In an exemplary embodiment of the present disclosure, forming an optical detecting device material layer on a side of the conductor protective layer facing away from the base substrate includes:

forming a semiconductor layer on a side of the conductor protective layer facing away from the base substrate; and forming a first conductor layer on a side of the semiconductor layer facing away from the base substrate.

In an exemplary embodiment of the present disclosure, forming an optical detecting device through patterning the optical detecting device material layer includes:

performing wet etching on the first conductor layer to form a first electrode; and performing dry etching on the semiconductor layer to form a photoelectric conversion layer.

In an exemplary embodiment of the present disclosure, the manufacturing method further includes:

forming an insulating layer on a side of the optical detecting device facing away from the base substrate and forming a via hole on the insulating layer; and forming a second electrode on a side of the insulating layer facing away from the base substrate and connecting the second electrode with the first electrode through the via hole.

In an exemplary embodiment of the present disclosure, forming an optical compensation control thin film transistor on the base substrate includes:

providing a base substrate;

forming an active layer on the base substrate;

forming a gate insulating layer on a side of the active layer facing away from the base substrate;

forming a gate on a side of the gate insulating layer facing away from the base substrate;

forming an interlayer dielectric layer on a side of the gate facing away from the base substrate; and forming source and drain electrodes on a side of the interlayer dielectric layer facing away from the base substrate.

In an exemplary embodiment of the present disclosure, the manufacturing method further includes: pre-processing the base substrate, including:

forming an light shielding layer on the base substrate; and forming a buffer layer on a side of the light shielding layer facing away from the base substrate, the optical compensation control thin film transistor being disposed on the buffer layer, and the orthographic projection of the active layer on the base substrate being located within the orthographic projection of the light shielding layer on the base substrate.

According to an aspect of the present disclosure, a display substrate is provided that includes:

a base substrate;

an optical compensation control thin film transistor located on a side of the base substrate, and the optical compensation control thin film transistor including a source electrode and a drain electrode;

a conductor pattern layer disposed on a side of the optical compensation control thin film transistor facing away from the base substrate; and an optical detecting device disposed on a side of the conductor pattern layer facing away from the base substrate;

wherein the optical detecting device is electrically connected with the source electrode or the drain electrode through the conductor pattern layer, and the orthographic projection of the optical detecting device on the base substrate and the orthographic projection of the conductor pattern layer on the base substrate are at least partially overlapped.

In an exemplary embodiment of the present disclosure, the orthographic projection of the optical detecting device on the base substrate is located within the orthographic projection of the conductor pattern layer on the base substrate.

In an exemplary embodiment of the present disclosure, the optical detecting device includes:

a photoelectric conversion layer disposed on a side of the conductor pattern layer facing away from the base substrate;

a first electrode disposed on a side of the photoelectric conversion layer facing away from the base substrate.

In an exemplary embodiment of the present disclosure, the display substrate further includes:

an insulating layer disposed on a side of the optical detecting device facing away from the base substrate, and the insulating layer being provided with a via hole;

a second electrode disposed on a side of the insulating layer facing away from the base substrate, and the second electrode being connected with the first electrode through the via hole.

In an exemplary embodiment of the present disclosure, the optical compensation control thin film transistor includes:

an active layer disposed on the base substrate;

a gate insulating layer disposed on a side of the active layer facing away from the base substrate;

a gate disposed on a side of the gate insulating layer facing away from the base substrate;

an interlayer dielectric layer disposed on a side of the gate facing away from the base substrate;

source and drain electrodes disposed on a side of the interlayer dielectric layer facing away from the base substrate.

In an exemplary embodiment of the present disclosure, the display substrate further includes:

a light shielding layer disposed on the base substrate;

a buffer layer disposed on a side of the light shielding layer facing away from the base substrate, the optical compensation control thin film transistor being disposed on the buffer layer, and the orthographic projection of the active layer on the base substrate being located within the orthographic projection of the light shielding layer on the base substrate.

According to an aspect of the present disclosure, a display panel is provided, including any one of the above-described display substrates.

According to an aspect of the present disclosure, a display apparatus is provided, including any one of the above-described display panels.

BRIEF DESCRIPTION OF THE DRAWINGS

The above and other features and advantages of the present disclosure will become more apparent through referring to the accompanying drawings to describe the example embodiment thereof in detail.

FIG. 7 is the structure schematic view of the display substrate which is on the basis of FIG. 6 after forming a black matrix, a color film layer and the like.

DETAILED DESCRIPTION

Figure 1:
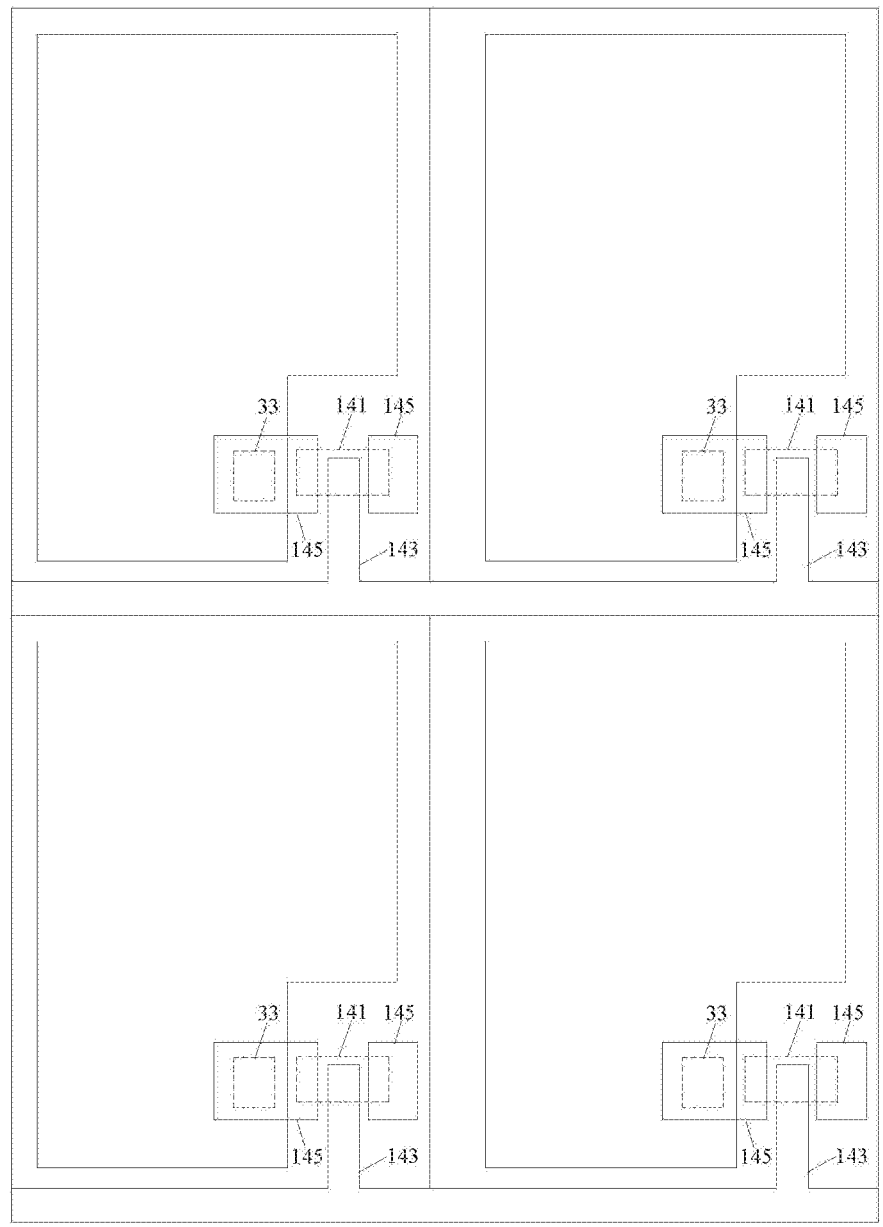
FIG. 1 is the configuration structure schematic view of the optical detecting device and the optical compensation control TFT in the related art.

Now, example embodiments will be described more comprehensively with reference to the accompanying drawings. However, example embodiments can be implemented via various manners and should not be understood as being limited to the embodiments set forth herein. Rather, these embodiments are provided so that the present disclosure will be comprehensive and complete, and the concepts of the example embodiments will be comprehensively communicated to those skilled in the art. The same reference numerals in the accompanying figures denote the same or similar components, thereby detailed description thereof will be omitted.

According to various embodiments, an OLED display panel may include a cover plate and a back plate. The configuration structure schematic view of the optical detecting device and the optical compensation control TFT in the related art is shown in FIG. 1. An optical compensation control thin film transistor (TFT) and an optical detecting device 33 may be disposed in each of the sub-pixel regions in the cover plate. The optical compensation control TFT is electrically connected with the optical detecting device 33 and an optical compensation integrated circuit (IC), and the optical compensation integrated circuit is outside of the OLED display panel. An organic light emitting layer and a driving circuit may be disposed in each of the sub-pixel regions in the back plate, and the organic light emitting layer may emit light towards the side of the cover plate under the drive of the driving circuit.

When the organic light emitting layer in a certain sub-pixel region emits light, the optical detecting device 33 in the sub-pixel region can detect the brightness of the light emitted by the organic light emitting layer and convert the brightness into a leakage current. The leakage current is led out to the optical compensation IC, which is outside of the OLED display panel through the optical compensation control TFT. The optical compensation IC can determine the brightness of the light emitted by the organic light emitting layer according to the magnitude of the received leakage current and, thereby control the brightness of the light emitted by the organic light emitting layer through the driving circuit in the sub-pixel region. For example, if the optical compensation IC determines that the brightness of the light emitted by the organic light emitting layer is lower, the driving circuit in the sub-pixel region can be controlled such that the driving circuit can improve the brightness of the light emitted by the organic light emitting layer.

When manufacturing the optical detecting device 33 in the OLED display panel, if the source and drain electrodes material layers of the optical compensation control TFT are first formed, the optical detecting device 33 is formed second, and the source and drain electrodes in the optical compensation control TFT are finally formed by etching treatment. In the etching process, the used etching liquid may damage the optical detecting device 33 to result in a lower accuracy of brightness compensation of the sub-pixels by the optical detecting device, thereby causing a poor display effect of the display panel.

If the source and drain electrodes in the optical compensation control TFT are first formed, the optical detecting device 33 is formed second in the process of forming the optical detecting device 33 because the material of the optical detecting device 33 includes a large amount of hydrogen (usually hydrogen ions or hydrogen molecules, etc.). The material of the optical detecting device 33, as well as the material of the interlayer dielectric layer in the optical compensation control TFT themselves, includes hydrogen, and the hydrogen may diffuse to the active layer 141 in the optical compensation control TFT to cause the optical compensation control TFT to be affected. The accuracy of the brightness compensation of the sub-pixels by the optical detecting device 33 is lower, thereby resulting in a poor display effect of the display panel.

The method for manufacturing the display substrate is not only applicable to the OLED, but also to QLED, and the OLED is taken as an example for description below.

Figure 2:
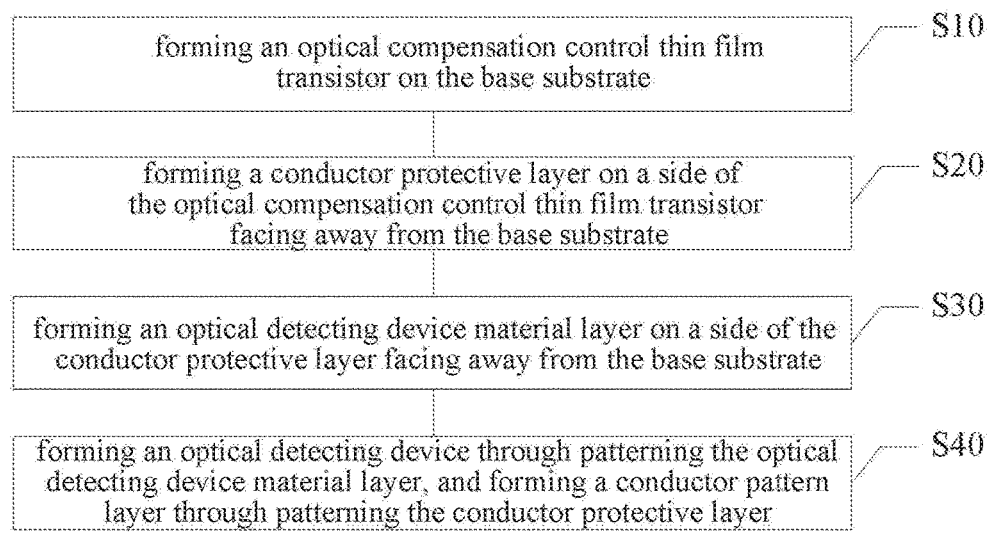
FIG. 2 is a flow schematic view of an embodiment of a manufacturing method of a display substrate according to the present disclosure.

The present example embodiment first provides a method for manufacturing a display substrate and a flow schematic view of an embodiment of a manufacturing method of a display substrate according to the present disclosure is shown in FIG. 2. The manufacturing method may include the following steps:

S10, forming an optical compensation control thin film transistor on the base substrate 11.

S20, forming a conductor protective layer 151 on a side of the optical compensation control thin film transistor facing away from the base substrate 11.

S30, forming an optical detecting device material layer 32 on a side of the conductor protective layer 151 facing away from the base substrate 11.

S40, forming an optical detecting device through patterning the optical detecting device material layer 32, and forming a conductor pattern layer 152 through patterning the conductor protective layer 151.

The optical detecting device is electrically connected with a source electrode or a drain electrode of the optical compensation control thin film transistor through the conductor pattern layer 152.

Each step of the manufacturing method of the OLED display substrate will be described in detail below.

Figure 3:
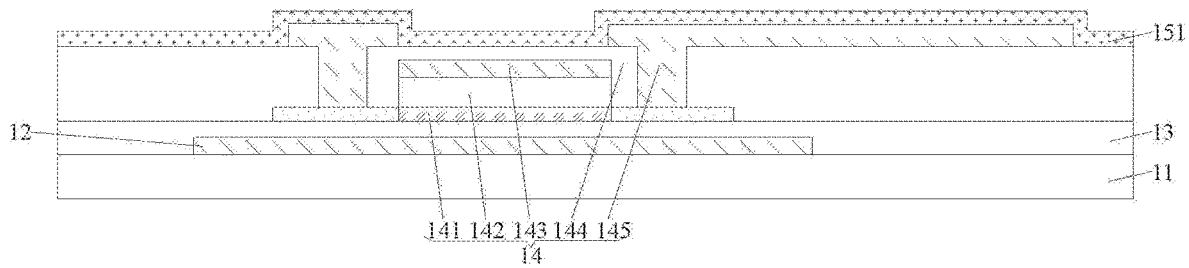
FIG. 3 is a structure schematic view of the display substrate after completing the step S10 and the step S20 in FIG. 2.

Reference is now made to the structure schematic view of the OLED display substrate in FIG. 3, which completes S10 and S20 shown in FIG. 2.

S10, forming an optical compensation control thin film transistor on the base substrate 11.

In the present example embodiment, it is necessary to form a light shielding layer 12 on the base substrate 11 and form a buffer layer 13 on a side of the light shielding layer 12 facing away from the base substrate 11 before the optical compensation control TFT 14 is formed. Specifically, a shielding material layer is formed on the base substrate 11 by any one of various ways, such as deposition, coating, sputtering, and the like. The shielding material layer is then formed into a light shielding layer 12 by a one-time patterning process, and the one-time patterning process may include photoresist coating, exposure, development, etching, and photoresist stripping. The buffer layer 13 is formed on the base substrate 11 on which the light shielding layer 12 is formed by any of various ways, such as deposition, coating, sputtering, and the like. The material of the light shielding layer 12 may be a metal material, such as metal molybdenum (Mo), metal copper (Cu), metal aluminum (Al), or an alloy material. The material of the buffer layer 13 may be silicon oxide, silicon nitride, silicon oxynitride, or the like.

An optical compensation control TFT 14 is further formed on the base substrate 11 on which the buffer layer 13 is formed, and the optical compensation control TFT 14 is schematically illustrated by a top gate type TFT (such as a top gate type TFT having a self-aligned structure). Of course, the optical compensation control TFT 14 can also be a bottom gate type TFT, for example, an etch stop layer (ESL) type TFT or a back channel etch type (BCE) type TFT, and the embodiments of the present disclosure are not so limited.

The specific forming process of the optical compensation control TFT 14 is as follows. First, an active material layer is formed on a side of the buffer layer 13 facing away from the base substrate 11 by any one of various ways, such as deposition, coating, sputtering, and the like, and the active material layer is then formed into an active layer 141 by a one-time patterning process. The one-time patterning process may include photoresist coating, exposure, development, etching, and photoresist stripping. The orthographic projection of the active layer 141 on the base substrate 11 is located within the orthographic projection of the light shielding layer 12 on the base substrate 11, that is, the light shielding layer 12 can completely shield the active layer 141 to prevent the ambient light from being irradiated to the active layer 141, and to avoid the phenomenon of the threshold voltage of the optical compensation control TFT 14 drifting. The material of the active layer 141 may be a metal oxide material, for example, ITO, indium gallium zinc oxide (abbreviation: IGZO) or indium-doped zinc oxide (abbreviation: IZO) and so on. The material of the active layer 141 may also be an inorganic material, such as polysilicon or amorphous silicon, and so on.

Thereafter, a gate insulating material layer and a gate material layer are formed on a side of the active layer 141 facing away from the base substrate 11 by any one of various ways, such as deposition, coating, sputtering, and the like. The gate material layer and the gate insulating material layer are then formed into a gate electrode 143 and a gate insulating layer 142 by a one-time patterning process, and the one-time patterning process may include photoresist coating, exposure, development, etching, and photoresist stripping. The gate electrode 143 may be first formed by wet etching the gate material layer, and the gate insulating layer 142 may be thereafter formed by dry etching the gate insulating material layer through shielding by a one mask plate. The material of the gate insulating material layer may be an insulating material, such as silicon oxide, silicon nitride, or silicon oxynitride, and so on. The material of the gate material layer may be a metal material, such as metal Mo, metal Cu, metal Al, or alloy material.

Then, an interlayer dielectric layer 144 is formed on a side of the gate electrode 143 facing away from the base substrate 11 by any one of various ways, such as deposition, coating, sputtering, and the like. The interlayer dielectric layer 144 is then formed into the interlayer dielectric layer 144 with through holes by the one-time patterning process, where the one-time patterning process may include photoresist coating, exposure, development, etching, and photoresist stripping.

Finally, a source and drain material layer is formed on a side of the interlayer dielectric layer 144 facing away from the base substrate 11 by any one of various ways, such as deposition, coating, sputtering, and the like. The source and drain material layer is then formed into the source and drain electrodes 145 by the one-time patterning process, and the source and drain electrodes 145 are connected with the active layer 141 through the through hole of the interlayer dielectric layer 144. The material of the source and drain electrode material layer may be a metal material, such as metal Mo, metal Cu, metal Al, or alloy material.

S20, forming a conductor protective layer 151 on a side of the optical compensation control thin film transistor facing away from the base substrate 11.

In the present example embodiment, the conductor protective layer 151 is formed on the base substrate 11 on which the optical compensation control thin film transistor is formed through any one of various ways, such as deposition, coating, sputtering, and the like. The material of the conductor protective layer 151 may be a metal material, such as metal Mo, metal Cu, metal Al, or alloy material.

Figure 4:
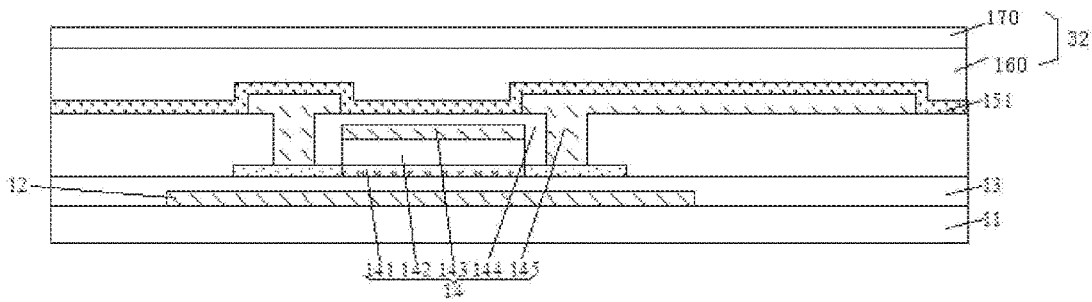
FIG. 4 is a structure schematic view of the display substrate after completing the step S30 in FIG. 2.

Reference is now made to the structural schematic view of a display substrate shown in FIG. 4, which is on the base of FIG. 3 after completing the step S30 in FIG. 2.

S30, forming an optical detecting device material layer 32 on a side of the conductor protective layer 151 facing away from the base substrate 11.

In the present example embodiment, the semiconductor layer 160 and the first conductor layer 170 may be sequentially deposited on the conductor protective layer 151 of each sub-pixel region in the base substrate 11 by plasma-enhanced chemical vapor deposition (PECVD). The semiconductor layer 160 includes an N-type semiconductor material layer, an intrinsic semiconductor material layer, and a P-type semiconductor material layer which are sequentially deposited. The N-type semiconductor material layer may be a phosphorus doped semiconductor or an arsenic doped semiconductor, and the P-type semiconductor material layer may be a boron doped semiconductor.

Figure 5:
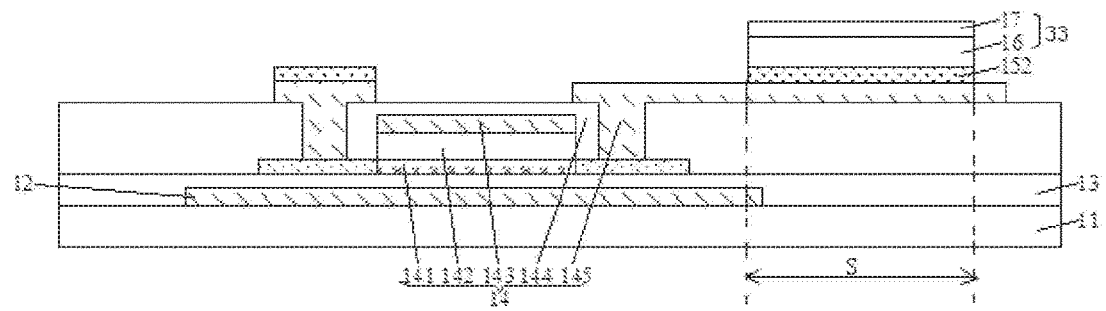
FIG. 5 is the structure schematic view of the display substrate which is on the base of FIG. 4 after completing the step S40 in FIG. 2.

Reference is now made to the structural schematic view of a display substrate shown in FIG. 5, which is on the base of FIG. 4 after completing the step S40 in FIG. 2.

S40, forming an optical detecting device through patterning the optical detecting device material layer 32, and forming a conductor pattern layer 152 through patterning the conductor protective layer 151.

In the present example embodiment, after the optical detecting device material layer 32 is shielded by the same mask plate, the first conductor layer 170 may be etched by wet etching to form the first electrode 17, the semiconductor layer 160 may then be etched by dry etching to form the photoelectric conversion layer 16, and the conductor protective layer 151 is etched by dry etching to form the conductor pattern layer 152 at the same time. The etching rate is effectively improved, and the manufacturing efficiency of the OLED display substrate is improved. Among them, the wet etching is a technique of immersing the etching material in the etching liquid for etching, so that the surface of the portion of the film, which is not masked by the resist, is removed by the actual chemical reaction. The dry etching is performed to expose the etching material to a gaseous state to generate plasma, and the plasma passes through a window opened in the photoresist to physically or chemically react with the etching material, thereby removing exposed surface materials, such as ion milling, plasma etching, and reactive ion etching. Of course, the optical detecting device and the conductor pattern layer 152 may also be formed by a one-time patterning process, and the one-time patterning process may include photoresist coating, exposure, development, etching, and photoresist stripping. In another embodiment, the semiconductor layer 160 may first be etched by dry etching to form the photoelectric conversion layer 16, and the conductor protective layer 151 is then etched by dry etching to form the conductor pattern layer 152. The area of the orthographic projection of the conductor pattern layer 152 on the base substrate can be controlled to be larger than the area of the orthographic projection of the optical detecting device 33 on the base substrate 11 to sufficiently ensure that the optical detecting device 33 is electrically connected with the source electrode or the drain electrode of the optical compensation control thin film transistor (TFT) 14.

Figure 6:
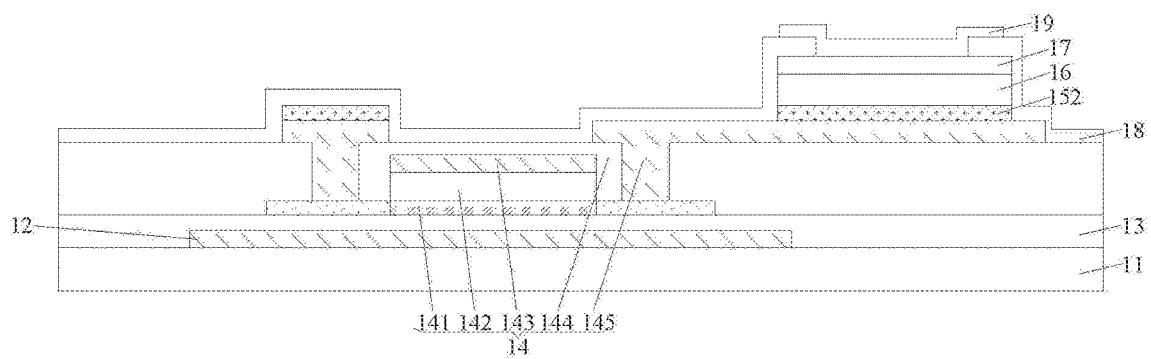
FIG. 6 is a structure schematic view of the display substrate which is on the basis of FIG. 5 after forming an insulating layer and a second electrode.

Reference is now made to the structural schematic view of the display substrate shown in FIG. 6 which is on the basis of FIG. 5 after forming the insulating layer 18 and the second electrode 19.

In the present example embodiment, an insulating material layer is formed on a side of the optical detecting device facing away from the base substrate 11 by any one of various ways, such as deposition, coating, sputtering, and the like. The insulating material layer is then formed into an insulating layer 18 by a one-time patterning process and a via hole is formed on the insulating layer 18. The orthographic projection of the via hole on the base substrate 11 is located within the orthographic projection of the first electrode 17 on the base substrate 11. The one-time patterning process may include photoresist coating, exposure, development, etching, and photoresist stripping. The material of the insulating material layer may be an insulating material, such as silicon oxide, silicon nitride, or silicon oxynitride, and so on.

Then, a second conductor layer is formed on a side of the insulating layer 18 facing away from the base substrate 11 by any one of various ways, such as deposition, coating, sputtering, and the like. The second conductor layer is then formed into the second electrode 19 by one-time patterning process, and the second electrode 19 is connected with the first electrode 17 through the via hole. The one-time patterning process may include photoresist coating, exposure, development, etching, and photoresist stripping. The material of the second conductor layer may be a transparent conductor material, such as ITO or IZO or the like.

Figure 8:
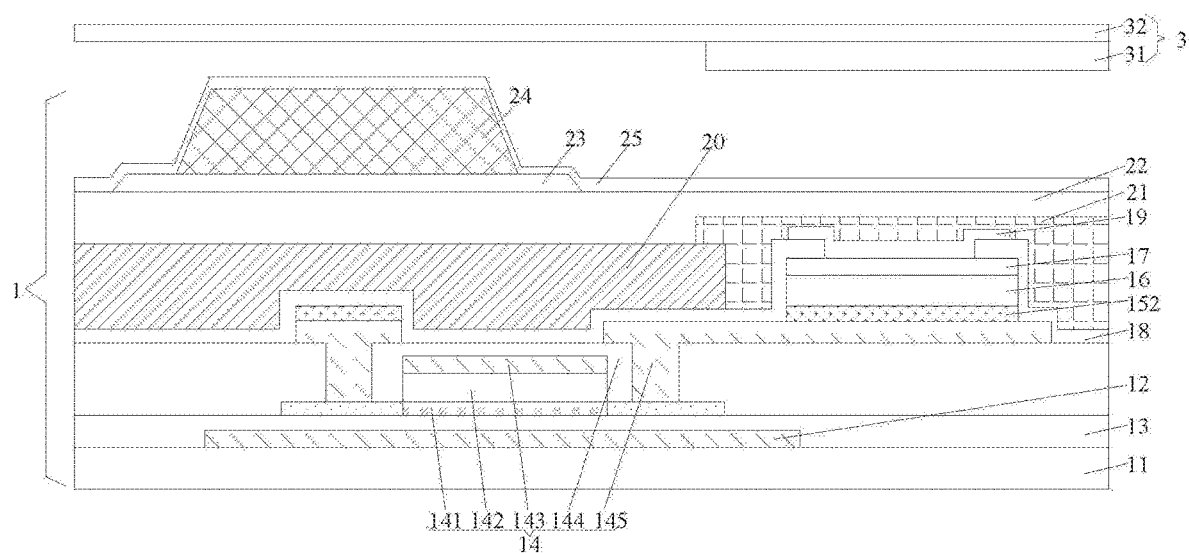
FIG. 8 is a structure schematic view of a display panel formed on the basis of FIG. 7.

In an example embodiment of the present disclosure, the optical compensation control TFT 14 and the optical detecting device of the OLED display substrate can be formed through the above-described steps. It should be noted that the OLED display substrate may be the cover plate 1 or the back plate 3 (FIG. 8). Since the structures of the cover plate 1 and the back plate 3 are different, the subsequent steps of the manufacturing method of the OLED display substrate are also different, and the example embodiments of the present disclosure are schematically illustrated by the following two implementable manners.

Figure 7:
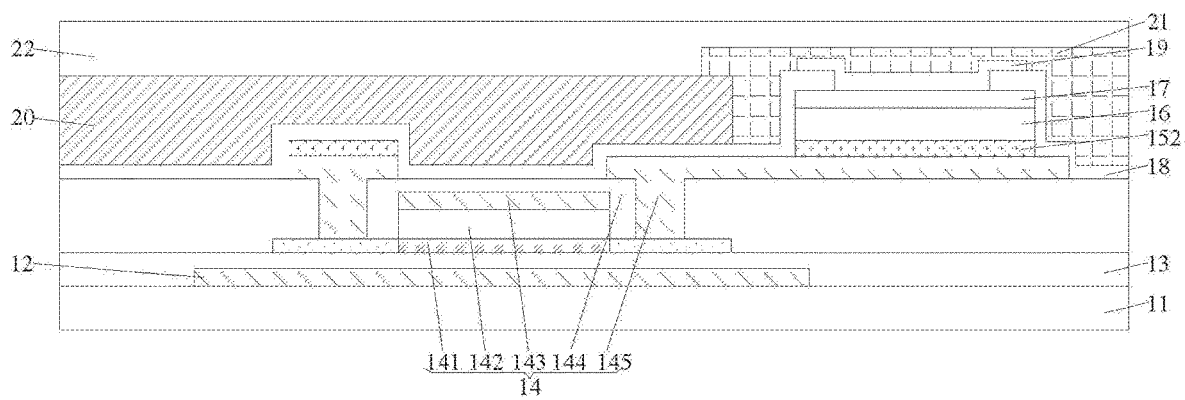

In the first implementation manner, reference is now made to the structural schematic view of the OLED display substrate shown in FIG. 7, which is on the basis of FIG. 6 after forming a black matrix 20, a color film layer 21, and the like. When the OLED display substrate is the cover plate 1, after the above steps are performed, the manufacturing method of the OLED display substrate may further include: a black matrix material layer being formed on a side of the insulating layer 18 facing away from the base substrate 11, the black matrix material layer being then formed into a black matrix 20 by a one-time patterning process, and the black matrix 20 covering the optical compensation control TFT 14. Thereafter, a color film material layer is formed on a side of the black matrix 20 facing away from the base substrate 11. The color film material layer is then formed into the color film layer 21 by the patterning process, so that the color film layer 21 is located on a side of the second electrode 19 facing away from the base substrate 11 and the color film layer 21 completely covers the optical detecting device, and the orthographic projection of the color film layer 21 on the base substrate 11 overlaps with the orthographic projection of the black matrix 20 on the base substrate 11. That is, the edge of the color film layer 21 covers on the edge of the black matrix 20. Then, the planarization layer 22 is formed on a side of the color film layer 21 facing away from the base substrate 11 by any of various ways, such as deposition, coating, sputtering, and the like. An auxiliary cathode material layer is formed on a side of the planarization layer 22 facing away from the base substrate 11, and the auxiliary cathode material layer is then formed into an auxiliary cathode 23 by the patterning process. The material of the auxiliary cathode material layer may be a metal material, such as metal Mo, metal Cu, metal Al, or alloy material. A spacer material layer is formed on a side of the auxiliary cathode 23 facing away from the base substrate 11, and the spacer material layer is formed into a spacer 24 by the patterning process. Finally, a transparent cathode layer 25 is formed on a side of the spacer 24 facing away from the base substrate 11 by any one of various ways, such as deposition, coating, sputtering, and the like. The material of the transparent cathode layer 25 may be a transparent conductor oxide, for example, transparent conductor film (TCO), azo compound (AZO), indium zinc oxide (IZO), amorphous zinc tin oxide (AZTO), or a combination of several materials and so on.

In the second implementation manner, when the OLED display substrate is the back plate 3, after the step of forming the second electrode 19, the manufacturing method of the OLED display substrate may further include: sequentially forming a color filter layer, a planarization layer, an anode, a pixel defining layer, an organic light emitting layer, and a cathode on the base substrate 11 on which the second electrode 19 is formed.

It should be noted that, in the process of forming the active layer 141, the gate insulating layer 18, the gate electrode 143, and the interlayer dielectric layer 144 in the optical compensation control TFT 14 as described in the steps above, a driving circuit may also be formed on the base substrate 11.

In summary, the embodiments of the present disclosure provide a manufacturing method of an OLED display substrate. An optical compensation control TFT 14 and an optical detecting device are formed on each sub-pixel region in the base substrate 11. The optical detecting device is electrically connected with one of a source electrode and a drain electrode in the optical compensation TFT. The brightness of the light emitted from the sub-pixel region can be detected by the optical detecting device. The detection result of the light brightness is output through the optical compensation control TFT 14, and the brightness of the sub-pixel region can then be compensated based on the detection result of the light brightness. Therefore, the real-time brightness compensation of the sub-pixels can be realized after the OLED display panel in which the OLED display substrate is located is shipped or otherwise moved from its manufacturing facility. First, an optical compensation control thin film transistor is formed and, to avoid the wet etching process in the process of manufacturing the source and drain electrodes 145 of the optical compensation control thin film transistor, which may damage the sidewall of the optical detecting device, the leakage current of the optical detecting device is improved. In the process of manufacturing an optical detecting device, through the conductor protective layer 151 protecting the optical compensation control thin film transistor, a large amount of H introduced in the process of manufacturing the optical detecting device is avoided to diffuse to the optical compensation control thin film transistor in the lower portion thereof, such that the optical compensation control thin film transistor characteristics is deteriorated.

Further, the present disclosure also provides an OLED display substrate. Referring to the structure schematic view of the OLED display substrate shown in FIG. 5, the OLED display substrate may include a base substrate 11, an optical compensation control thin film transistor, a conductor pattern layer 152, and an optical detecting device. The optical compensation control thin film transistor is disposed on the base substrate 11, and the optical compensation control thin film transistor includes a source electrode and a drain electrode. The conductor pattern layer 152 is disposed on a side of the optical compensation control thin film transistor facing away from the base substrate 11. The optical detecting device is disposed on a side of the conductor pattern layer 152 facing away from the base substrate 11. Among them, the optical detecting device is electrically connected with the source electrode or the drain electrode through the conductor pattern layer 152, and the orthographic projection of the optical detecting device on the base substrate 11 is located in the orthographic projection of the conductor pattern layer 152 on the base substrate 11. Referring to FIG. 5, the projections of the optical detecting device 33 (including the first electrode 17 and the photoelectric conversion layer 16) and the conductor pattern layer 152 on the base substrate overlaps in the S region.

In the present example embodiment, the optical compensation control thin film transistor may include an active layer 141, a gate insulating layer 142, a gate electrode 143, an interlayer dielectric layer 144, and a source and drain electrodes 145. The active layer 141 is disposed on the base substrate 11. The gate insulating layer 142 is disposed on a side of the active layer 141 facing away from the base substrate 11. The gate electrode 143 is disposed on a side of the gate insulating layer 142 facing away from the base substrate 11. The interlayer dielectric layer 144 is disposed on a side of the gate electrode 143 facing away from the base substrate 11. The source and drain electrodes 145 are disposed on a side of the interlayer dielectric layer 144 facing away from the base substrate 11.

In the present example embodiment, the OLED display substrate may further include a light shielding layer 12 and a buffer layer 13. The light shielding layer 12 is disposed on the base substrate 11. The buffer layer 13 is disposed on a side of the light shielding layer 12 facing away from the base substrate 11, and the optical compensation control thin film transistor is disposed on the buffer layer 13, where the orthographic projection of the active layer 141 on the base substrate 11 is located within the orthographic projection of the light shielding layer 12 on the base substrate 11.

In the present example embodiment, the optical detecting device may include a photoelectric conversion layer 16 and a first electrode 17, and the photoelectric conversion layer 16 is disposed on a side of the conductor pattern layer 152 facing away from the base substrate 11. The first electrode 17 is disposed on a side of the photoelectric conversion layer 16 facing away from the base substrate 11. The photoelectric conversion layer 16 may include an N-type semiconductor layer, an intrinsic semiconductor layer, and a P-type semiconductor layer which are disposed from the bottom to the top. The optical detecting device and the conductor pattern layer 152 are etched to form through shielding by the same mask plate, and the specific forming process is described in detail in the above described manufacturing method of the OLED display substrate.

In the present example embodiment, reference is now made to the structural schematic view of the OLED display substrate shown in FIG. 6 which is on the basis of FIG. 5 after forming the insulating layer 18 and the second electrode 19. The OLED display substrate may further include an insulating layer 18 and a second electrode 19. The insulating layer 18 is disposed on a side of the optical detecting device facing away from the base substrate 11, and the insulating layer 18 is provided with a via hole. The second electrode 19 is disposed on a side of the insulating layer 18 facing away from the base substrate 11, and the second electrode 19 is connected with the first electrode 17 through the via hole.

It should be noted that the OLED display substrate in FIG. 6 may be the cover plate 1 or the back plate 3, and the structures of the cover plate 1 and the back plate 3 are different. In the present example embodiment, the OLED display substrate is taken the cover plate 1 as an example to illustrate. Reference is now made to the structural schematic view of the OLED display substrate shown in FIG. 7 which is on the basis of FIG. 6 after forming a black matrix 20, a color film layer 21, and the like. The OLED display substrate may further include a black matrix 20, a color film layer 21, a planarization layer 22, an auxiliary cathode 23, a spacer 24, and a transparent cathode. The black matrix 20 is disposed on a side of the insulating layer 18 facing away from the base substrate 11. The color film layer 21 is disposed on a side of the second electrode 19 facing away from the base substrate 11, and the orthographic projection of the color film layer 21 on the base substrate 11 partially overlaps with the orthographic projection of the black matrix 20 on the base substrate 11. The planarization layer 22 is disposed on a side of the color film layer 21 facing away from the base substrate 11. The auxiliary cathode 23 is disposed on a side of the planarization layer 22 facing away from the base substrate 11. The spacer 24 is disposed on a side of the auxiliary cathode 23 facing away from the base substrate 11. The transparent cathode is disposed on a side of the spacer 24 facing away from the base substrate 11.

Further, the present disclosure further provides an OLED display panel, which may include the above-described OLED display substrate. The specific structure of the OLED display substrate has been described in detail above and therefore, will not be described here.

Reference is now made to the structural schematic view of the OLED display panel shown in FIG. 8. The OLED display panel is a top emission type OLED display panel, and the optical compensation control TFT 14 and the optical detecting device in the OLED display panel may be disposed on the cover plate 1. The OLED display panel may further include a back plate 3, where the back plate 3 may include a back plate glass 32 and an organic light emitting layer 31 disposed on the back plate glass 32, where the organic light emitting layer 31 is disposed opposite to the optical detecting device so that the optical detecting device can receive the light emitting intensity of the organic light emitting layer 31.

Also, the OLED display panel may be a bottom emission type OLED display panel, and the optical compensation control TFT and the light detecting device in the OLED display panel may be disposed on the back plate. The OLED display panel may further include a cover plate which may be a glass cover plate.

Further, the present disclosure further provides a display apparatus, and the display apparatus may include the above described OLED display panel. The display apparatus can be any product or component having display function, such as electronic paper, mobile phone, tablet computer, television, display, notebook computer, digital photo frame, navigator, and the like.

Optionally, the display apparatus may further include an optical compensation IC, where the optical compensation IC can be electrically connected with the optical compensation control TFT 14 and the optical detecting device in the display apparatus, and illustratively, the optical compensation IC can be electrically connected with the optical detecting device through the connection electrode.

The features, structures, or characteristics described above may be combined in one or more embodiments with any suitable manner, and the features discussed in each embodiment are interchangeable, if possible. In the description above, many details are provided to thereby give a thorough understanding of the embodiments of the disclosure. However, those skilled in the art will realize that the technical scheme of the disclosure can be practiced without one or more details, or other methods, components, materials, etc. may also be adopted. In the other cases, common structures, materials, or operations are not shown or described in detail to avoid obscuring aspects of the disclosure.

Although relativity terms, such as "top" and "bottom", are used in present specification to describe the relative relationship between one component of an icon and another component, these terms are used in present specification only for convenience, such as according to the direction of the example described in the accompanying drawings. Understandably, if the apparatus of the icon is flipped upside down, the component described on the "top" will become the component described on the "bottom". Other relative terms, such as "higher", "lower", "top" and "bottom", will have the similar meanings. When a structure is "on" another structure, it may be that the structure is integrally formed on the other structure, or that the structure is "directly" disposed on other structure, or that the structure is "indirectly" disposed on the other structure through another structure.

In the present specification, the terms "one", "a/an", "this", and "said" are used to denote the existence of one or more elements/components/etc. The terms "containing", "including", and "having" are used to denote the meaning of open inclusion and refer to the existence of additional elements/components/etc. in addition to the listed elements/components/etc. The terms "first", "second", and "third" are used only as markers, not as restrictions on the number of their objects.

It should be understood that the present disclosure does not limit its application to the detailed structure and arrangement of the components presented in the specification. The present disclosure can have other embodiments and can be implemented and executed in a variety of ways. The foregoing variations and modifications are intended to fall within the scope of the present disclosure. It should be understood that the subject matter disclosed and claimed herein extends to all alternative combinations of two or more individual features that are mentioned or apparent in the specification and/or accompanying drawings. All of these different combinations constitute a number of alternative aspects of the present disclosure. The embodiments described in the specification are illustrative of the best mode of the present disclosure, and will enable those skilled in the art to utilize the present disclosure.

What is claimed is:

1. A display substrate, comprising:
   a base substrate;
   an optical compensation control thin film transistor on a side of the base substrate, the optical compensation control thin film transistor comprising:
      an active layer on the base substrate;
      a gate insulating layer on a side of the active layer facing away from the base substrate;
      a gate on a side of the gate insulating layer facing away from the base substrate;
      an interlayer dielectric layer on a side of the gate facing away from the base substrate; and
      a source electrode and a drain electrode on a side of the interlayer dielectric layer facing away from the base substrate;
   a conductor pattern layer on a side of the optical compensation control thin film transistor facing away from the base substrate;
   an optical detecting device on a side of the conductor pattern layer facing away from the base substrate;
   a light shielding layer on the base substrate; and
   a buffer layer on a side of the light shielding layer facing away from the base substrate, the optical compensation control thin film transistor being disposed on the buffer layer, and an orthographic projection of the active layer on the base substrate being located within an orthographic projection of the light shielding layer on the base substrate;
   wherein the optical detecting device is electrically connected with the source electrode or the drain electrode through the conductor pattern layer, and an orthographic projection of the optical detecting device on the base substrate and an orthographic projection of the conductor pattern layer on the base substrate are at least partially overlapped.

2. The display substrate according to claim 1, wherein the orthographic projection of the optical detecting device on the base substrate is located within the orthographic projection of the conductor pattern layer on the base substrate.

3. The display substrate according to claim 1, wherein the optical detecting device comprises:
   a photoelectric conversion layer on the side of the conductor pattern layer facing away from the base substrate; and
   a first electrode on a side of the photoelectric conversion layer facing away from the base substrate.

4. The display substrate according to claim 3, further comprising:
   an insulating layer on a side of the optical detecting device facing away from the base substrate, and the insulating layer being provided with a via hole; and
   a second electrode on a side of the insulating layer facing away from the base substrate, the second electrode being connected with the first electrode through the via hole.

5. A display panel, comprising:
   a display substrate, comprising:
      a base substrate;
      an optical compensation control thin film transistor on a side of the base substrate, the optical compensation control thin film transistor comprising:
         an active layer on the base substrate;
         a gate insulating layer on a side of the active layer facing away from the base substrate;
         a gate on a side of the gate insulating layer facing away from the base substrate;
         an interlayer dielectric layer on a side of the gate facing away from the base substrate; and
         a source electrode and a drain electrode on a side of the interlayer dielectric layer facing away from the base substrate;
      a conductor pattern layer on a side of the optical compensation control thin film transistor facing away from the base substrate;
      an optical detecting device on a side of the conductor pattern layer facing away from the base substrate;
      a light shielding layer on the base substrate; and
      a buffer layer on a side of the light shielding layer facing away from the base substrate, the optical compensation control thin film transistor being disposed on the buffer layer, and an orthographic projection of the active layer on the base substrate being located within an orthographic projection of the light shielding layer on the base substrate;
      wherein the optical detecting device is electrically connected with the source electrode or the drain electrode through the conductor pattern layer, and an orthographic projection of the optical detecting device on the base substrate and an orthographic projection of the conductor pattern layer on the base substrate are at least partially overlapped.

6. The display panel according to claim 5, wherein the orthographic projection of the optical detecting device on the base substrate is located within the orthographic projection of the conductor pattern layer on the base substrate.

7. The display panel according to claim 5, wherein the optical detecting device comprises:
   a photoelectric conversion layer on the side of the conductor pattern layer facing away from the base substrate; and
   a first electrode on a side of the photoelectric conversion layer facing away from the base substrate.

8. The display panel according to claim 5, further comprising a back plate, the back plate comprising back plate glass and an organic light emitting layer on the back plate glass, the organic light emitting layer being opposite to the optical detecting device.

9. The display panel according to claim 5, wherein the display panel is implemented in a display apparatus.

* * * * *